United States Patent
Magesacher et al.

(10) Patent No.: US 6,829,629 B1
(45) Date of Patent: Dec. 7, 2004

(54) COMB FILTER SYSTEM FOR DECIMATING A SEQUENCE OF DIGITAL INPUT VALUES TO A SEQUENCE OF DIGITAL OUTPUT VALUES BY A NON-INTEGER FACTOR

(75) Inventors: Thomas Magesacher, Villach (AT); Lajos Gazsi, Duesseldorf (DE); Peter Caldera, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/019,366
(22) PCT Filed: Apr. 28, 2000
(86) PCT No.: PCT/DE00/01349
   § 371 (c)(1),
   (2), (4) Date: Jun. 12, 2002
(87) PCT Pub. No.: WO00/67375
   PCT Pub. Date: Nov. 9, 2000

(30) Foreign Application Priority Data

Apr. 29, 1999 (DE) .......................................... 199 19 575

(51) Int. Cl.[7] .............................................. G06F 17/17
(52) U.S. Cl. ...................................................... 708/313
(58) Field of Search ........................... 708/313; 341/143

(56) References Cited

U.S. PATENT DOCUMENTS

| | | | |
|---|---|---|---|
| 4,954,824 A | | 9/1990 | Yamada et al. |
| 4,999,798 A | * | 3/1991 | McCaslin et al. ............ 708/313 |
| 5,187,482 A | * | 2/1993 | Tiemann et al. ............ 341/143 |
| 5,751,615 A | | 5/1998 | Brown |
| 6,014,682 A | * | 1/2000 | Stephen et al. ............. 708/313 |
| 6,034,628 A | | 3/2000 | Draxelmayr |
| 6,163,787 A | * | 12/2000 | Menkhoff .................... 708/313 |

FOREIGN PATENT DOCUMENTS

| | | |
|---|---|---|
| EP | 0 695 032 A1 | 1/1996 |
| WO | WO 94/23492 | 10/1994 |

* cited by examiner

Primary Examiner—Tan V. Mai
(74) Attorney, Agent, or Firm—Fish & Richardson P.C.

(57) ABSTRACT

A comb filter arrangement has an integrator that outputs an input value to a signal path. The signal path includes a delay stage for adjusting the input value using a delay factor, a decimator that converts the input value into a decimated output value using a non-integral factor, a differentiator that generates an intermediate output value from the input value, and an interpolation arrangement that receives the intermediate output value and generates a decimated sequence of the output value.

19 Claims, 3 Drawing Sheets

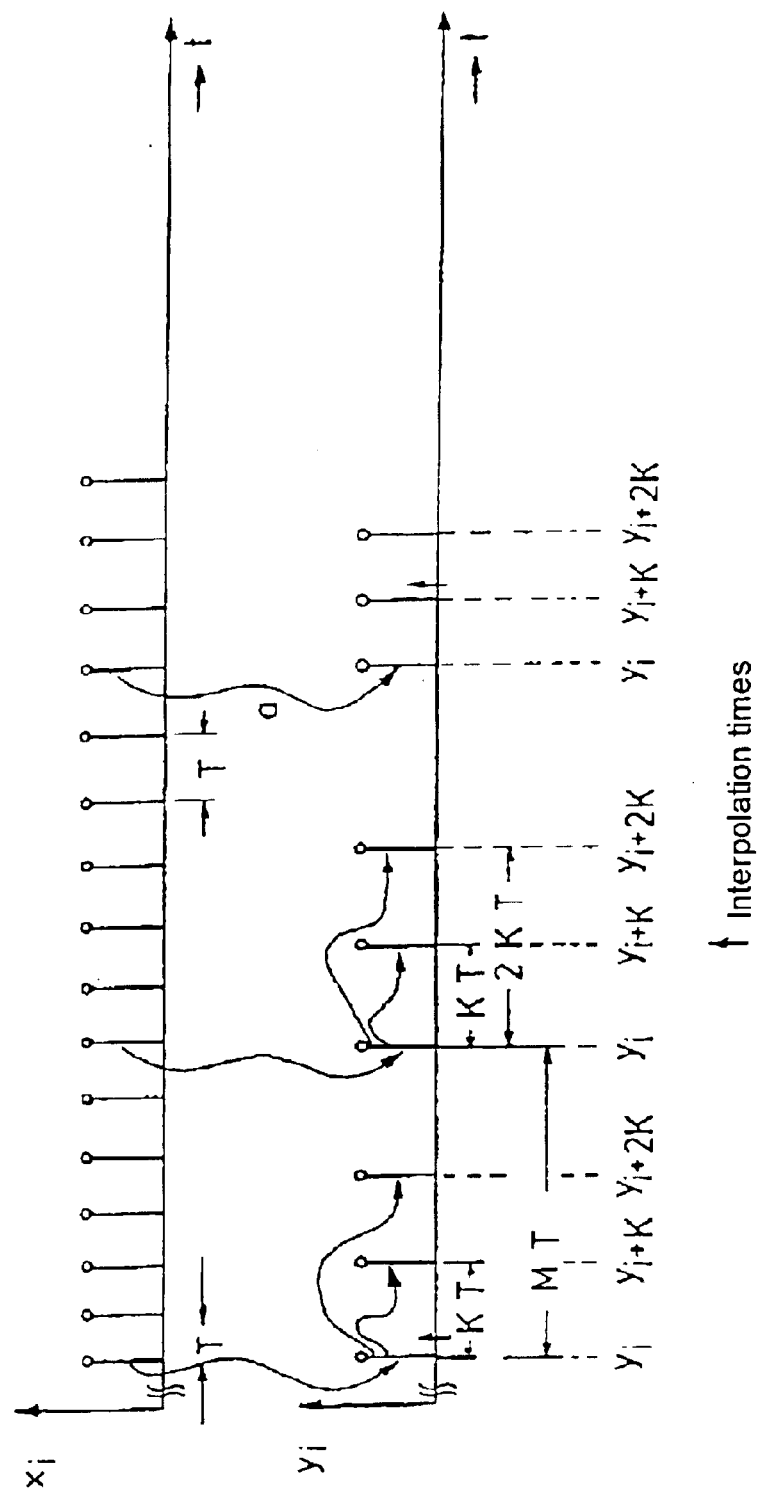

COMB FILTER SYSTEM FOR DECIMATING A SEQUENCE OF DIGITAL INPUT VALUES TO A SEQUENCE OF DIGITAL OUTPUT VALUES BY A NON-INTEGER FACTOR

The present invention relates to a comb filter arrangement for decimating a sequence of digital input values into a sequence of digital output values by a non-integral factor.

EP 0889587 A1 discloses such a comb filter arrangement which has an input-end integrator whose output is fed to two signal paths, each signal path having an adjustable delay stage and a following decimator stage as well as an output-end differentiator stage. In addition, in this known comb filter arrangement there is a buffer which carries out the function of an interpolation stage.

U.S. Pat. No. 4,999,798 discloses a transient recovery-free interpolation decimator which has one adjustable delay stage and one interpolation stage per signal path.

WO 94/23492 discloses a decimation filter with cascading of at least three signal paths.

In order to recover the clock for conventional modem applications or what are referred to as MDSL applications, decimation by a non-integral factor is often necessary. In sigma-delta analog/digital conversion, comb filter arrangements are generally used for decimation, there being a multiplicity of implementation possibilities for such comb filter arrangements.

A known comb filter arrangement is illustrated in FIG. 1. However, the comb filter arrangement shown there is suitable only for decimating a sequence of digital input values $x_i$ into a sequence of digital output values $y_j$ by an integral factor M. For this purpose, the circuit arrangement according to FIG. 1 has an input-end integrator 10 of the n-th order, a following decimator stage 124 by the integral factor M and an output-end differentiator 126, also of the n-th order.

The integrator 10 of the n-th order has n stages which are connected in series, each stage comprising an input-end adder 12 to which two input signals are fed, namely a signal which is fed back via a line 16 and a signal which originates from the signal path and which is the digital input value $x_i$ in the first stage. The output of the adder 12 is connected to a delay stage 14. In a following stage, the output of this delay stage 14 forms, on the one hand, the input signal for the adder 12 of this following stage and, on the other hand, also the output of the adder 12 is connected to a delay stage 14. In a following stage, the output of this delay stage 14 forms, on the one hand, the input signal for the adder 12 of this following stage and, on the other hand, also the signal which is fed back to the assigned adder 12 via the line 16. For an integrator of the third order, for example three such stages, each with an adder 12, a delay element 14 and a feedback loop 16, are necessary.

The output signal of such an integrator 10 of the n-th order is fed to the decimator stage 124, which filters out, for example, only every tenth incoming sampled value. The output of the decimator stage 124 is connected to the differentiator 126 which has already been mentioned and which also has a predefined number of stages connected in series, in accordance with the order of the differentiator. These stages each have in turn an adder 128, a delay stage 130 and a line 132, but, in contrast to the stages of the integrator 10, they are wired differently. Two input signals, namely on the one hand the signal on the line 132 of the signal path and the signal which is delayed and inverted with respect thereto in the delay stage 130, are in turn fed to the adder 128. The output of the adder 128 is then fed to the one input of the adder 128 of a following stage, and also to the delay stage 130 there. Three such stages connected in series are necessary in order to implement a differentiator of the third order.

Such a comb filter arrangement is suitable for decimating the sequence of digital input values $x_I$ by an integral factor M, for example 10.

The invention is based on the object of developing the comb filter arrangement which is described in FIG. 1 and is known, in such a way that it is possible to decimate the sequence of digital input values $x_i$ by a non-integral factor.

This object is achieved by means of a comb filter arrangement having the features of claim 1.

Developments of the comb filter arrangement are the subject matter of the subclaims.

According to the invention, an input-end integrator of the n-th order, whose output is fed to at least three signal paths, is accordingly provided. Each signal path has a delay stage with a delay which can be set to different values, a following decimator stage by an integral factor M, and an output-end differentiator stage for generating intermediate output values. An interpolation arrangement, at whose output the sequence of digital output values $y_j$ which are decimated by the non-integral factor can be tapped, is connected to the output of the three signal paths.

The interpolation arrangement is constructed in such a way that it always interpolates between two intermediate output values which are present at the output end on the three signal paths and have an interval of k/f (f=sampling rate and k=delay factor). The interpolation is expediently a linear interpolation.

The differentiator stages of the individual signal paths operate according to the invention with a sampling rate which is reduced by the factor M, as a result of which the expenditure on adders and delay elements is advantageously low. In order to achieve the non-integral change in the sampling rate, the interpolation is carried out according to the invention between two intermediate output values which are delayed by the respective signal paths.

In one embodiment of the invention, the interpolation arrangement has two switch-over devices whose three inputs are each connected to an output of the three differentiator stages and whose outputs are each connected to one amplifier. Furthermore, an adder stage is provided for adding the output signals of the two amplifiers.

A further embodiment of the invention provides a control device for switching over the switch-over devices in each case in accordance with the two intermediate output signal values to be interpolated.

Another embodiment of the invention provides for the interpolation arrangement to carry out a linear interpolation in accordance with $$y_j = \alpha \cdot y_{i+I} + (1-\alpha) \cdot y_i$$

or $$y_j = \alpha y_{i+k} + (1-\alpha) \cdot y_{i+3k}$$

For this purpose, only two multiplication operations and one addition operation are required within the interpolation arrangement at the low sampling rate. After a predefined number of such interpolation operations, the system is switched over to interpolation, as stated in the above formulae, between the two value pairs ($y_i$, $y_{i+k}$) and the value pair ($y_{i+k}$, $Y_{i+2k}$).

A very central feature of the comb filter arrangement according to the present invention is the fact that only two value pairs are required for interpolation. Because n differentiators are provided in the respective signal paths after the decimator stage in the comb filter arrangement according to the invention, the comb filter arrangement requires n steps for transient recovery so that only the n+1-th output value after the switching over in the switch-over devices can be used by the input sequence. For this reason, each differentiator chain in the signal paths must already be phased in n steps before it is connected to the output.

It is of crucial significance in the comb filter arrangement according to the invention that the interpolation always takes place between two values which are at an interval of k·T (T=1/f, f=high sampling rate). As a result, in all cases it is possible to interpolate k times between the value pairs ($y_i$, $y_{i+k}$) without requiring a new support point. These are precisely those k steps which are required by a chain of k differentiators for the transient recovery and/or which are required in order to calculate the values of the k registers of the differentiators. The output value of the differentiator chain can then already be used in the next step.

A comb filter arrangement according to the invention can be implemented in a wide variety of ways. The third signal path can be implemented, for example, by means of a separately constructed differentiator chain corresponding to the logic for phasing in and switching over. However, it is also possible to implement just one software calculation and to correspondingly charge the registers of the differentiator chain.

The comb filter arrangement according to the invention is explained in more detail below in conjunction with an exemplary embodiment with reference to further figures, in which:

FIG. 3 shows an outline of sequences of input values, intermediate output values and output values in the circuit arrangement of FIG. 2 as well as the associated interpolation values.

In the following figures, identical reference symbols indicate identical parts with identical meaning, unless stated otherwise.

Figure 1:
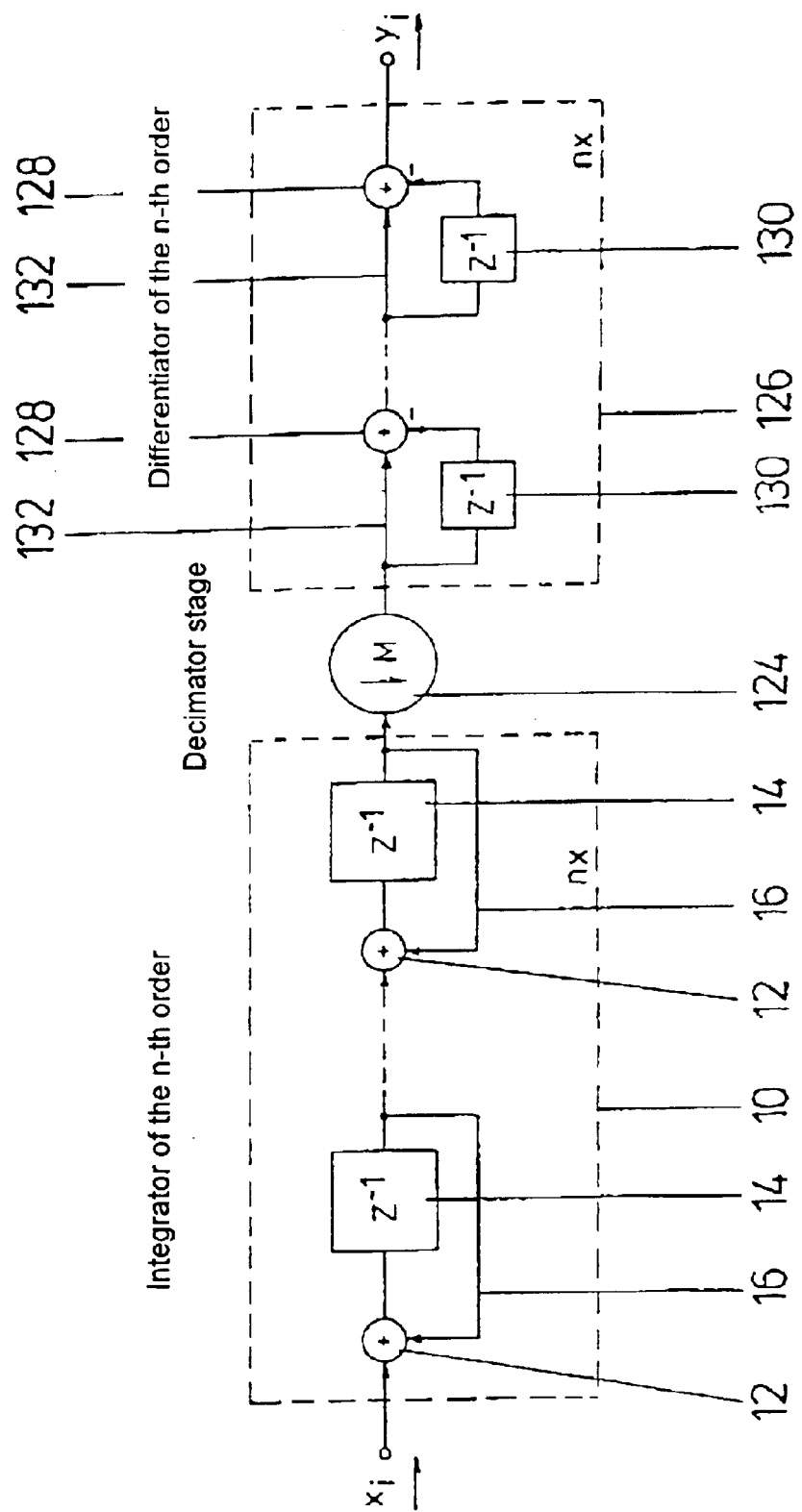
FIG. 1 shows a comb filter arrangement according to the prior art.
Figure 2:
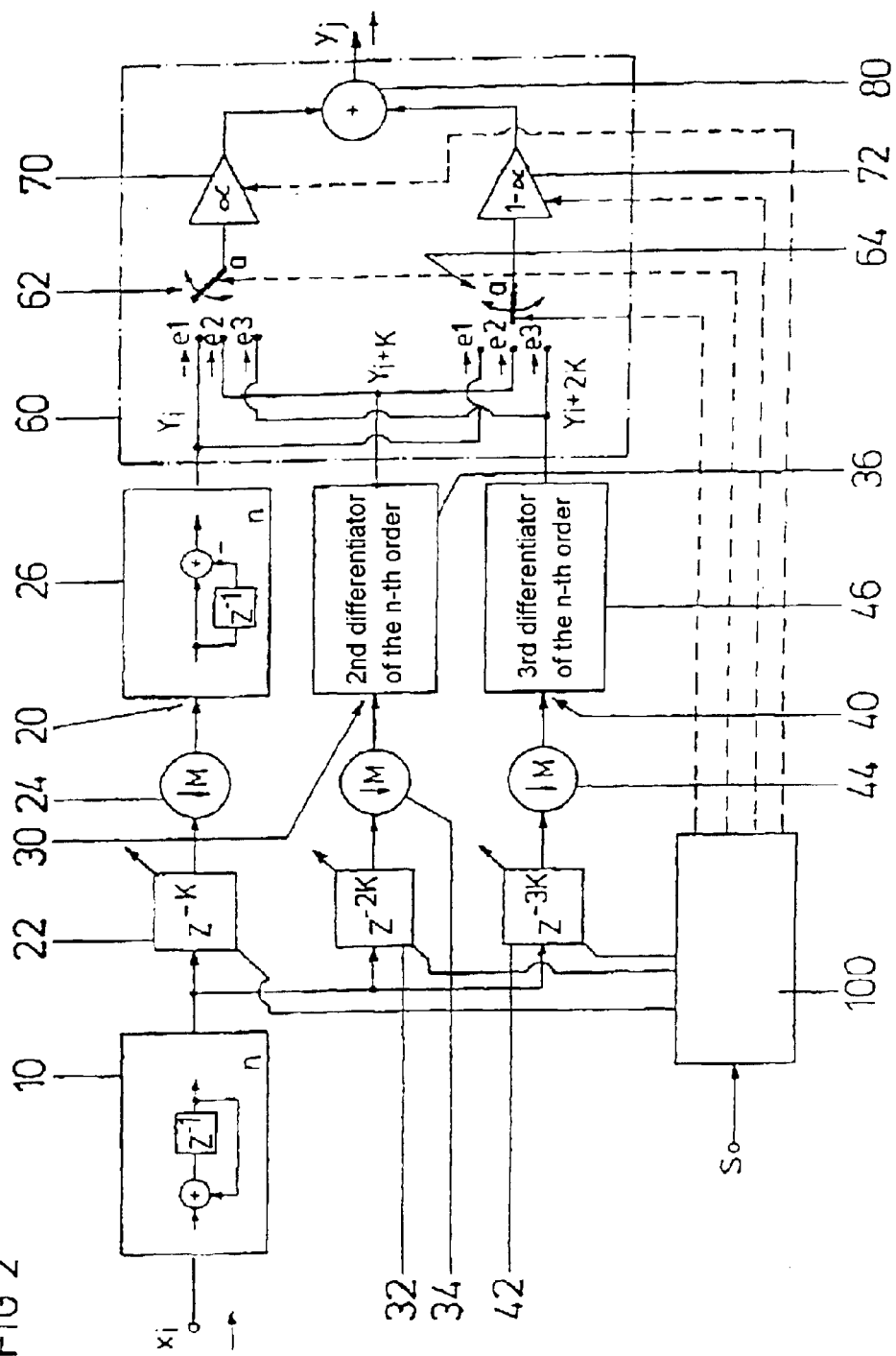
FIG. 2 shows a comb filter arrangement according to the present invention in a block circuit diagram.

FIG. 2 shows a comb filter arrangement for decimating a sequence of digital input values $x_i$ into a sequence of digital output values $y_j$ by a non-integral factor M+α, M being a positive integer, that is to say M=1, 2, 3, ... etc., and 0<α<1. The arrangement has an input-end integrator 10 of the n-th order, as has been explained, for example, in conjunction with FIG. 1. The output of the integrator 10 is split into three signal paths 20, 30, 40. The first signal path 20 has a delay stage 22 with a downstream decimator stage 24 and a downstream differentiator 26. The decimator stage 24 decimates the sequences of data delayed in the delay stage 22. The differentiator 26 is of the n-th order. A sequence of intermediate output values $y_i$ can be tapped at the output of the differentiator 26. The output of the differentiator 26 is connected to two input terminals e1, each of a switch-over device 62, 64.

The second signal path 30 and the third signal path 40 are of very similar construction to the first signal path 20 and each have a delay stage 32, 42 with downstream decimator stage 34, 44 and further downstream differentiators 36 and 46. A sequence of intermediate output values $Y_{i+k}$ can be tapped at the output of the second differentiator, and a sequence of intermediate output values $Y_{i+2k}$ can be tapped at the output of the third differentiator. The output of the second differentiator 36 is connected to second input terminals e2 of the first switch-over device 62 and of the second switch-over device 64. The output of the third differentiator 46, which is of the n-th order like the first differentiator 26 and the second differentiator 36, is connected to a third input terminal e3 of the first switch-over device 62 and to a third input terminal e3 of the second switch-over device 64. The delay time of the delay stages 22, 32 and 42 can be adjusted by a control device 100 using a control signal S.

In the comb filter arrangement of FIG. 2, the delay stage 22 delays by k·T, the delay stage 32 by 2k·T and the delay stage 42 by 3k·T (where T=1/f, f=sampling rate and k=the basic delay factor).

The two switch-over devices 62, 64 are configured in such a way that they switch the signals present at the input terminals e1, e2 or e3 to an output terminal a of the respective switch-over device 62, 64. The output terminal a of the switch-over device 62 is connected to a first amplifier 70 which is connected at the output end to an input terminal of an adder 80. The output terminal a of the switch-over device 64 is connected to the input terminal of a second amplifier 72 whose output terminal is connected to a second input terminal of the adder 80. At the output of the adder 80 it is possible to tap a sequence of output values $y_j$ which is decimated by a non-integral factor with respect to the of input data $x_v$. The two switch-over devices 62, 64, the two amplifiers 70, 72 and the adder 80 form an interpolation arrangement 60.

The non-integral factor is, for example, M+α, M being a positive integer, that is to say 1, 2, 3 etc., and α=gain factor of the first amplifier 70. The gain factor of the second amplifier 72 which is selected is then 1−α.

As is also apparent from FIG. 2, the control device 100 can control the switching over of the two switch-over devices 62 and 64 and the gain factor of the two amplifiers 70 and 72.

The method of operation of the circuit arrangement illustrated in FIG. 2 is explained in conjunction with the sequences of input values and output values illustrated in FIG. 3.

A sequence of digital input values $x_i$ is illustrated by way of example at the top of FIG. 3. The individual input values $x_i$ have an interval of T from one another.

In the diagram below the latter in FIG. 3, a sequence of digital values is illustrated. It is assumed that the integral factor M=6. The associated values decimated from the sequence of input values $x_i$ are determined by the interval M·T. Between these values there are further signal values which are predefined by the delay k·T or 2k·T.

The individual signal values resulting from this are designated, in accordance with the convention, as intermediate output values $y_i$, $y_{i+k}$ and $y_{i+2k}$ in accordance with the delay or lack of delay thereof. The interpolation times to be interpolated are indicated in FIG. 3 by arrows. As is apparent, the interpolation times are always between two intermediate output values, namely between $y_i$ and $y_{i+k}$ on the one hand and between $y_{i+k}$ and $y_{i+2k}$ on the other.

The interpolation arrangement 60 illustrated in FIG. 2, comprises the two switch-over devices 62 and 64, the two amplifiers 70 and 72 and the adder 80. The control device 100 switches the two switch-over devices 62 and 64 over and selects the gain factors of the amplifiers 70 and 72 in such a way that a linear interpolation is implemented.

The control device 100 ensures that in principle linear interpolation is carried out between the values $y_i$ and $y_{i+k}$ according to the formula $$y_j = \alpha y_{i+1} + (1+\alpha) \cdot y_i.$$

For this purpose, only two multiplication operations and one addition operation at the low sampling rate are required.

However, after k such interpolation procedures, instead of the value pair $y_i$, $y_{i+k}$ the value pair $y_{i+k}$, $y_{i+2k}$ is required for interpolation.

Because the second part of the comb filter arrangement illustrated in FIG. 2 composed of the respective n differentiator stages 26, 36 and 46 connected in series requires n steps for its transient recovery, the control device 100 must make allowance for the fact that only the (n+1)-th output value is used after the switching over of the input sequence. For this reason, each differentiator chain 13 must be phased in n steps before it is switched to the output.

What is claimed is:

1. An arrangement for decimating an input value, the arrangement comprising:
an integrator that outputs the input value to a signal path, the signal path including;
a delay stage configured to adjust the input value using a delay factor;
a decimator configured to convert the input value into a decimated output value using a non-integral factor;
a differentiator configured to generate an intermediate output value from the input value; and
an interpolation arrangement configured to receive the intermediate output value and generates a decimated sequence of the output value.

2. The arrangement of claim 1 wherein the integrator is of an n-th order.

3. The arrangement of claim 2 wherein the delay stage is defined by m times k, where m is a positive integer and k is the delay factor.

4. The arrangement of claim 3 wherein the delay factor of the delay stage is selected to differ from a second delay factor of a second delay stage by an integral multiple.

5. The arrangement of claim 3 wherein m equals n.

6. The arrangement of claim 1 wherein the delay stage is configured to adjust a sequence of digital input values.

7. The arrangement of claim 1 wherein the decimator is configured to convert the input value into a sequence of digital output values.

8. The arrangement of claim 1 wherein the decimator is configured to use a non-integral factor defined by M+α, where M is a positive integer and α is greater than zero and less than one.

9. The arrangement of claim 1 wherein the interpolation arrangement interpolates between a plurality of intermediate output values having k/f intervals, wherein k is a delay factor determined by the delay stage and f is a sampling rate.

10. The arrangement of claim 1 wherein the interpolation arrangement includes a switching device connected to the differentiator.

11. The arrangement of claim 10 wherein the interpolation arrangement further includes an amplifier arrangement connected to the switching device.

12. The arrangement of claim 11 wherein the switching device is configured to receive the input value from the differentiator and generate the decimated output value sent to the amplifier arrangement.

13. The arrangement of claim 11 wherein the amplifier arrangement includes a first amplifier and a second amplifier, the first amplifier having a gain factor of α and the second amplifier having a gain factor of 1−α, wherein α is greater than zero and less than one.

14. The arrangement of claim 10 wherein the interpolation arrangement further includes an adder for combining the decimated output value of the amplifier arrangement.

15. The arrangement of claim 10 further comprising a control device for switching the switching device in accordance with the intermediate output value received by the interpolation arrangement.

16. The arrangement of claim 15 wherein the control device is configured to determine the delay factor of the delay stage by adjustably setting the delay factor to different values.

17. The arrangement of claim 1, wherein the interpolation arrangement is configured to generate a linear interpolation.

18. The arrangement of claim 1 further comprising a microprocessor for processing the input value to generate the decimated sequence of the output value.

19. An arrangement for decimating an input value comprising:
an integrator of an n-th order configured to output the input value to a signal path, the signal path including:
a delay stage configured to adjust the input value that includes a sequence of digital input values using a delay factor, where the delay stage is defined by m times k, m being a positive integer and k being the delay factor;
a decimator configured to convert the input value into a decimated output value using a non-integral factor defined by M+α, where M is a positive integer and α is greater than zero and less than one;
a differentiator configured to generate an intermediate output value from the input value; and
an interpolation arrangement configured to receive the intermediate output value and generates a decimated sequence of the output value, wherein the interpolation arrangement interpolates between a plurality of intermediate output values having k/f intervals, wherein f is a sampling rate, the interpolation arrangement including:
a switching device connected to the differentiator, the switching device configured to receive the input value from the differentiator and generate the decimated output value sent to the amplifier arrangement;
an amplifier arrangement connected to the switching device; and
an adder configured to combine the decimated output value of the amplifier arrangement; wherein the amplifier arrangement includes a first amplifier and a second amplifier, the first amplifier having a gain factor of a and the second amplifier having a gain factor of 1−α.

* * * * *